(12) United States Patent
Alain et al.

(10) Patent No.: US 6,569,544 B1
(45) Date of Patent: May 27, 2003

(54) ELECTROLUMINESCENT DEVICE

(75) Inventors: Nüesch Frank Alain, Lausanne (CH); Rotzinger François, Chavornay (CH); Si-Ahmed Lynda, Lausanne (CH); Zuppiroli Libero, Giez (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 0 days.

(21) Appl. No.: 09/463,880

(22) PCT Filed: Jul. 31, 1998

(86) PCT No.: PCT/CH98/00324
§ 371 (c)(1),
(2), (4) Date: Jan. 31, 2000

(87) PCT Pub. No.: WO99/07028
PCT Pub. Date: Feb. 11, 1999

(30) Foreign Application Priority Data

Jul. 31, 1997 (CH) .............................................. 1844/97

(51) Int. Cl.$^7$ ................................................ H05B 33/14
(52) U.S. Cl. ...................... 428/690; 428/704; 428/917; 313/504; 313/506; 252/301.16; 252/301.26; 257/40; 257/103
(58) Field of Search ................................ 428/690, 704, 428/917; 313/504, 506; 252/301.16, 301.26; 257/40, 103

(56) References Cited

FOREIGN PATENT DOCUMENTS

EP 074807 * 3/1983 ............. G02F/1/01

OTHER PUBLICATIONS

Ullrich et al (Proc. SPIE–Int. Soc. Opt. Eng. (1996) 2629, Biomedical Optoelectronics in Clinical Chemistry and Biotechnology, 88–95), No month.*

* cited by examiner

Primary Examiner—Deborah Jones
Assistant Examiner—Ling Xu
(74) Attorney, Agent, or Firm—Clifford W. Browning; Woodard, Emhardt, Naughton, Moriarty & McNett LLP

(57) ABSTRACT

The invention concerns a electroluminescent device with a multilayer structure comprising: i) a first electrode including a layer, consisting of a transparent or translucent conductive material selected among metal oxides and metal nitrides, said layer being deposited on a transparent support, consisting of a glass, silicon, alumina plate, or a polymer sheet; ii) a second electrode; iii) a layer, arranged between the two electrodes, comprising a semiconductor and electroluminescent solid organic substance, said layer being optionally bordered with one or several intermediate layers, consisting of electrocatalysts; and iv) a layer with monomolecular structure, arranged between the layer consisting of the conductive material and the layer consisting of the electroluminescent substance. Said device is furher characterised in that said layer consists of a dipolar organic compound whereof the structure has an electronic system π, a functional group, vicinal or not of the electronic system π. Moreover, the dipolar organic compound is chemically bound by the functional group to the conductive material and has chemical affinity for the organic electroluminescent substance.

8 Claims, 8 Drawing Sheets

ELECTROLUMINESCENT DEVICE

The present invention relates to an electroluminescent device.

Electroluminescent devices can in particular be used as electroluminescent diodes forming part of the design of display devices or flat screens for computers or television sets.

In such multilayer structure devices, a semiconducting electroluminescent solid organic substance is arranged in a layer between two electrodes at least one of which consists of a transparent, or at least translucent material.

When an electrical voltage is applied between the two electrodes, this organic substance has the property of emitting light. The current flow is then accompanied by a transfer of charges between, on the one hand, each of the electrodes and, on the other hand, the semiconducting and electroluminescent organic substance. The electrode connected to the negative terminal injects electrons into the organic substance. As for the electrode connected to the positive terminal, it injects holes into the organic substance, in other words it captures the electrons emitted by this substance.

Electroluminescent devices of this kind are already known, in which the semiconducting and electroluminescent organic substance is chosen from fluorescent, monomer or polymer organic molecules. It can also consist of a mixture of these fluorescent molecules. As an example of fluorescent molecules, we may cite molecules belonging to the family of naphthalene, anthracene, coronene, perylene, as well as acridine, carbazole, phthalocyanines, metal complexes of 8-hydroxyquinoline possibly doped with coumarin or polymer molecules with a conjugated electronic system such as poly(para-phenylene-vinylene) or poly(para-phenylene).

In general, an emission band corresponding to a particular colour is associated with a type of fluorescent organic molecule. The wide choice of molecules now enables almost the whole colour spectrum to be covered. The choice of the materials of the electrodes is important in producing such an electroluminescent device.

In addition, of course, to these materials having to possess good electrical conducting properties, they must be chosen so that at least one of the two electrodes is transparent to light, or at least translucent, in order to allow the radiation emitted by the electroluminescent organic substance to pass through. Moreover, these materials must be chosen so that each of the electrodes can inject charges, holes for one, electrons for the other, into the semiconducting and electroluminescent organic substance. This transfer of either one of the charges is heavily dependent upon the height of the energy barrier that may exist between on the one hand the work function of the electrode, in other words its capacity to extract or capture electrons, and on the other hand the oxidation or reduction potential of the organic substance.

According to the previous state of technology relating to devices of this kind, only the material of the hole-injecting electrode can be transparent to light. The material of the electron-injecting electrode is generally opaque to light. The result of this is that it is impossible to imagine that the available devices to date could emit the same quality of light through either of their faces equally, and even simultaneously through both faces.

The materials used for making transparent hole-injecting electrodes are generally chosen from metal oxides. We may cite the example of the mixed oxide of indium and tin.

These metal oxide-based materials are capable of injecting holes directly into numerous organic emitters such as, for example, poly(para-phenylene-vinylene). It has been shown by I. D. Parker that the work function of the electrode is then very close to the oxidation potential of the semiconductor and electroluminescent organic substance (J. Appl. Phys., 1994, 75, 1656).

However, it happens that electrodes consisting of metal oxide-based materials cannot adequately inject holes directly into certain organic emitters. This is particularly the case when the electroluminescent substance is tris(8-hydroxyquinoline) of aluminium. This substance possesses remarkable emission properties, but its oxidation potential is unfortunately too high, much greater than the electrode's work function. Therefore, organic substances, that may be termed electrocatalysts, are used, whose role is to facilitate the crossing of the energy barrier and consequently the injection of holes into the electroluminescent substance. They also enable the transport of holes from the electrode into the electroluminescent substance whilst impeding the reverse transfer of electrons to the electrode.

Thus, C. W. Tang et al. have described an electroluminescent device in which a layer consisting of an electrocatalyst derived from triphenylamine is interposed between the metal oxide-based electrode and the layer consisting of the electroluminescent substance (Appl. Phys. Lett., 1987, 51, 913).

U.S. Pat. No. 5,231,329 discloses a similar device, in which an electrocatalyst, with a polymer structure derived from aniline, is arranged between the mixed indium and tin metal oxide-based electrode and the organic emitter with a polymer structure derived from 8-hydroxyquinoline.

Recently, Q. Pei et al. have described an electroluminescent device in which the transported charges are not just electrons and holes, but also ions (Science 1995, 269, 1086). In this type of device, the semiconductor and electroluminescent substance, in this case a polymer or a mixture of polymers, also acts as a solid electrolyte for ion transport. According to the authors, the optimization of such a substance that transports both ions, electrons and holes, still poses many problems, especially in contact with the electrodes.

The materials generally used for making electron-injecting electrodes are chosen from metals or electrically conductive metal alloys. We may cite the examples of aluminium, magnesium, titanium, molybdenum or an alloy of magnesium and silver.

Evidently such metal materials cannot be transparent to light when they are arranged in a layer within such electroluminescent devices.

These metal materials also display other drawbacks, unlike the metal oxides, of being sensitive to corrosion and of not being fashioned according to the techniques of photolithography or silkscreen printing.

It also happens that these metal electrodes cannot adequately inject electrons directly into certain organic emitters. This occurs when this substance possesses a too low reduction potential in relation to the work function of the electrode. It is possible, in this case also, to interpose a layer consisting of electrocatalysts, such as substances derived from oxadiazole for example.

Since the introduction of layers consisting of organic electrocatalysts into electroluminescent devices has enabled the constraints due to crossing energy barriers to be overcome, it is now possible to envisage using a great variety of electroluminescent substances and electrode pairs and making numerous combinations of them.

The fact remains that the charge transfers between the electrodes and the various kinds of organic substances, emitters or electrocatalysts, take place at the interface of heterogeneous materials, inorganic on the one hand, organic on the other. According to the previous examples, this can be a metal oxide-organic substance interface in the case of hole injection, or a metal-organic substance interface in the case of electron injection.

Strong electrical fields are created at these interfaces, in particular when charge transfer is not very effective. One of the consequences of this is the appearance of detachments of the organic layer applied onto the electrode. This phenomenon could be the cause of part of the deterioration of the materials observed in these devices, which precludes them from consideration for an industrial application.

Recently, F. Nuesch et al. became interested in the phenomena that could occur at the interfaces of heterogeneous materials (Adv. Mater., 1997, 9, 222). An electroluminescent device was constructed comprising an electrode consisting of mixed indium and tin oxide and an organic electroluminescent substance, in this case poly(paraphenylene). Thanks to an attachment group, they were able to chemically bind the organic electroluminescent substance to the metal oxide of the electrode. However, the use of this type of basically apolar, polyaromatic molecules is made difficult owing to their very poor solubility in the usual organic solvents.

Heterogeneity between inorganic materials, on the one hand, and organic materials, on the other, leads to another difficulty often encountered when designing electroluminescent devices, which is being able to ensure good distribution as well as good adhesion of the organic matter forming the layer deposited on the surface of one or other of the electrodes, but also being able to control its thickness. Defects in one or other of these parameters are liable to initiate breakdowns, destroying the device.

The purpose of the present invention is to provide an electroluminescent device in which it is possible to adapt on demand the work function of any electrode, consisting of a conductive material chosen from among the metal oxides and metal nitrides, to the oxidation-reduction potentials of a wide variety of semiconductor electroluminescent solid organic substances.

The invention also has the purpose of providing an electroluminescent device in which it is possible to adapt on demand the work function of any electrode, consisting of a conductive material chosen from among the metal oxides and metal nitrides, in such a way that the same material of this electrode can inject, as the case may be, holes or electrons into these electroluminescent substances.

The invention also has the purpose of providing an electroluminescent device in which the material forming at least one of the two electrodes, in particular that of the electron-injecting electrode, is transparent to light, or at least translucent.

Another purpose of the invention is to improve the transfer of charges at the interface of heterogeneous materials and, as a result, prevent deterioration of the materials of the electroluminescent device.

The invention has the further purpose of improving the distribution and adhesion of the organic matter of the layer deposited on the material of one or other of the electrodes.

Accordingly, the present invention relates to an electroluminescent device with a multilayer structure comprising:

i) a first electrode including a layer consisting of a transparent or translucent, electrically conductive material, chosen from among the metal oxides and metal nitrides, the said layer being deposited on a transparent support, consisting of a glass, silicon, alumina plate or a polymer sheet;

ii) a second electrode;

iii) a layer, arranged between the two electrodes, comprising a semiconducting electroluminescent solid organic substance, possibly an ion conductor, the said layer being optionally bordered by one or more intermediate layers, consisting of electrocatalysts; and iv) a layer of monomolecular structure, arranged between the layer consisting of the conductive material and the layer consisting of the electroluminescent substance;

this device being characterized by the fact that the said layer of monomolecular structure consists of a dipolar organic compound whose structure has an electronic system $\pi$, a functional group, vicinal or not of the electronic system $\pi$, the said dipolar organic compound on the one hand being chemically bound by the said functional group to the said conductive material and, on the other, having a chemical affinity for the said organic electroluminescent substance.

By the nature of its electrical dipole moment, its value and its relative orientation, the said dipolar organic compound confers upon the said conductive material forming the first electrode, to which it is chemically bound, the property of either injecting holes, or injecting electrons, into the said semiconductor electroluminescent solid organic substance.

The values of the dipole moments of the dipolar organic compounds can be evaluated by applying in particular the Hartree Fock semi-empirical calculation method performed according to ideal conditions using the ZINDO method (J. Ridley et al., Theoret. Chim. Acta., 1976, 42, 223 and A. Bacon et al., Theoret. Chim. Acta., 1976, 53, 21). Strictly speaking, the semi-empirical method should not be applied to the isolated molecule, but to this same molecule in its adsorbed state on the surface of the material of the electrode. The ZINDO method, as well as other calculation programs used in theoretical chemistry, can be used to determine the net dipole moment of the adsorbed molecule by proceeding, for example, as follows: thanks to the ZINDO method, we can first of all optimize the geometry of the molecule placed in the neighbourhood of a portion of surface of the material representing the electrode; we can then calculate, in this geometry, the dipole moment of the adsorbed molecule itself.

In order that the said conductive material forming the first electrode can inject holes into the semiconducting electroluminescent solid organic substance, the dipolar organic compound chemically bound to the said material is chosen advantageously in such a way that its electrical dipole moment is a vector whose absolute value is between 1 Debye unit and 50 Debye units. The orientation of this vector is such that the positive pole is located in the vicinity of the conductive material, whilst the negative pole is far away from it.

By chemically binding dipolar organic compounds having such dipole moments to the conductive material, it is possible to inject holes into the semiconductor electroluminescent solid organic substances, crossing the energy barriers which would have been between 0.5 eV and 1.5 eV if the conductive material had been used bare.

The passage of the flow of charges, in this case of holes, is probably due to an increase in the work function of the electrode formed of the said conductive material to which the said dipolar organic compound has been chemically bound. This can be explained by a cooperative effect of the dipoles of the organic compound, which generates an electrical field at the surface of the electrode and reduces the energy barrier to be crossed.

In order that the said conductive material forming the first electrode can inject electrons into the semiconducting electroluminescent solid organic substance, the dipolar organic compound chemically bound to the said material is chosen advantageously in such a way that its electrical dipole moment is a vector whose absolute value is between 1 Debye unit and 50 Debye units. The orientation of this vector is such that the negative pole is located in the vicinity of the conductive material, whilst the positive pole is far away from it.

By chemically binding dipolar organic compounds having such dipole moments to the conductive material, it is possible to inject electrons into the semiconductor electroluminescent solid organic substances, crossing the energy barriers which would have been between 0.5 eV and 1.5 eV if the conductive material had been used bare.

The passage of the flow of charges, in this case of electrons, is probably due to a reduction in the work function of the electrode formed of the said conductive material to which the said dipolar organic compound has been chemically bound. This can be explained by a cooperative effect of the dipoles of the organic compound, which generates an electrical field at the surface of the electrode and reduces the energy barrier to be crossed.

The said dipolar organic compound, whose structure has an electronic system π, a functional group, vicinal or not of the electronic system π, is chemically bound by the said functional group to the conductive material. The said functional group is advantageously chosen from the group including carboxylic acid, carboxylate, phosphoric acid, phosphonate and the chelatihg groups α-keto-enolate, oxime, hydroxyquinoline. In preference, the said functional group is located in a vicinal position in relation to the said electronic system π so as to ensure a abetter cover of the electron orbitals and thereby ensure a better transfer of charges between the electrode and the organic electroluminescent substance.

According to the functional group chosen, the chemical bond acting between this group and the conductive material of the electrode is a covalent bond, an ion bond, a dipole-dipole bond or a hydrogen bond.

In preference, the said dipolar organic compound confers the property of injecting holes into the semiconducting electroluminescent solid organic substance upon the conductive material, to which it is chemically bound via the intermediary of the functional group, if the said functional group is chosen from the group including carboxylic and phosphoric acids.

In preference, the said dipolar organic compound confers the property of injecting electrons into the semiconducting electroluminescent solid organic substance upon the conductive material, to which it is chemically bound via the intermediary of the functional group, if the said functional group is chosen from the group including the carboxylate and phosphonate.

Through the electronic system π, which constitutes a part of its structure, the said dipolar organic compound, chemically bound to the said conductive material, is able to carry then transfer the charges, electrons or holes as the case may be, which have been extracted from the conductive material, into the semiconducting electroluminescent solid organic substance.

Through the chemical affinity shown by the said dipolar organic compound towards the semiconducting electroluminescent solid organic substance, the transfer of charges, electrons or holes as the case may be, between the dipolar organic compound and the organic electroluminescent substance takes place easily. This chemical affinity is expressed in terms of bonds of the ionic type, dipole-dipole type, charge transfer type, hydrogen type or Van der Waals type, between a part of the chemical structure of the dipolar organic compound and a part of the chemical structure of the organic electroluminescent substance.

According to one of the variants of the electroluminescent device in conformity with the invention, the dipolar organic compound is found in the form of an organometallic complex with the following general formulae (I) to (VI):

  formula (I), in which,

M is chosen from Ru(II), Os(II), Cr(II), Al(III), Ga(III) and In(III), $L^1$ is a ligand with the general formula a), and L is a ligand with the general formula b);

  formula (II), in which,

M and $L^1$ are as defined above,

L is a ligand with the general formula b), and

L' is a ligand with the general formula a), c), d) or e);

  formula (III), in which,

M and $L^1$ are as defined above,

L and L' are each, independently of one another, a ligand with the general formula a), c), d) or e);

  formula (IV), in which

M and $L^1$ are as defined above,

L is a ligand with the general formula b), and

L' is a ligand with the general formula f);

  formula (V),

M and $L^1$ are as defined above,

L is a ligand with the general formula a), c), d) or e);

X is chosen from the group of co-ligands comprising Cl⁻, Br⁻, I⁻, NCS⁻, CN⁻, NCO⁻;

  formula (VI), in which,

M, $L^1$ and X are as defined above,

L is a ligand with the general formula f);

the general formulae a), b), c), d) and f) being:

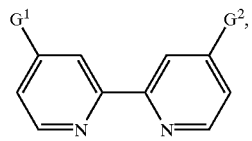

formula a)

in which $G^1$ and $G^2$ are the same or different and are chosen from the group comprising —COOH, —COO⁻, —PO₃H₂, —PO₃H⁻,

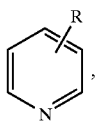
formula b)

in which R is chosen from the group including hydrogen, phenyl, vinyl, primary, secondary, tertiary or quaternary amine, hydroxyl, alkyl with 1 to 30 carbon atoms;

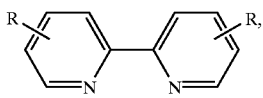
formula c)

in which the Rs are defined, independently of one another, as above;

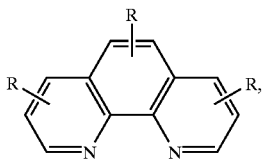
formula d)

in which the Rs are defined, independently of one another, as above;

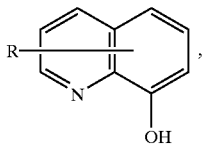
formula e)

in which the Rs are defined, independently of one another, as above;

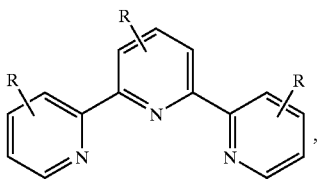
formula f)

in which the Rs are defined, independently of one another, as above.

The ligands L and L' are chosen according to the chemical affinity they display towards the semiconductor electroluminescent solid organic substance.

In preference, the said dipolar organic compound confers the property of injecting holes into the semiconductor electroluminescent solid organic substance upon the conductive material, to which it is chemically bound via the intermediary of the said functional group, if it is found in the form of an organometallic complex with the preceding general formulae (V) and (VI) in which the $G^1$ and $G^2$ groups, present in formula a) of the ligand $L^1$, are the same and chosen from —COOH and $PO_3H_2$.

In preference again, the said dipolar organic compound confers upon the conductive material, to which it is chemically bound via the intermediary of the said functional group, the property of injecting holes into the semiconductor electroluminescent solid organic substance, if it is in the form of an organometallic complex with the general formula V:

$$ML^1L(X)_2 \qquad \text{formula (V)},$$

in which,

M is chosen from Ru(II), Os(II), Cr(II), Al(III), Ga(III) and In(III), $L^1$ and L are the same and are ligands with the general formula a) as defined above and in which the groups $G^1$ and $G^2$ are the same and are chosen from the —COOH and —$PO_3H_2$ and X is selected from the group of co-ligands comprising  $Cl^-$, $Br^-$, $I^-$, $NCS^-$, $CN^-$, $NCO^-$;

In preference again, the said dipolar organic compound confers upon the conductive material, to which it is chemically bound via the intermediary of the said functional group, the property of injecting holes into the semiconductor electroluminescent solid organic substance, if it is the dithiocyanate of bis(4,4'-dicarboxy-2,2'-bipyridyl)ruthenium(II) in the form of tetra-acid.

In preference, the said dipolar organic compound confers on the conductive material, to which it is chemically bound via the intermediary of the said functional group, the property of injecting electrons into the semiconductor electroluminescent solid organic substance, if it is found in the form of an organometallic complex with the preceding general formulae (I) to (IV) in which the $G^1$ and $G^2$ groups present in formula a) of the ligand $L^1$, are the same and are chosen from —$COO^-$ and $PO_3H^-$.

In preference again, the said dipolar organic compound confers upon the conductive material, to which it is chemically bound via the intermediary of the said functional group, the property of injecting electrons into the semiconductor electroluminescent solid organic substance, if it is in the form of an organometallic complex with the general formula IV;

$$ML^1LL' \qquad \text{formula (IV)},$$

in which,

M is chosen from Ru(II), Os(II), Cr(II), Al(III), Ga(III) and In(III), $L^1$ is a ligand with the general formula a) as defined above and in which the $G^1$ and $G^2$ groups are the same and are chosen from —$COO^-$ and $PO_3H^-$, and L and L' are the same and are ligands with the general  formula d) as defined above.

In preference again, the said dipolar organic compound confers upon the conductive material, to which it is chemically bound via the intermediary of the said functional group, the property of injecting electrons into the semiconductor electroluminescent solid organic substance, if it is the [bis-(4,4'-diphenyl-1,10-phenanthrolene)—(4,4'-dicarboxy-2,2'-bipyridyl)]ruthenium-(II) in the form of internal salts.

According to another of the variants of the electroluminescent device in conformity with the invention, the dipolar organic compound possesses one of the following general formulae (VII) or (VIII):

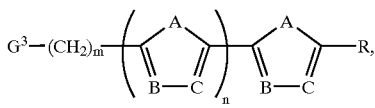

formula (VII)

in which,

G³ is the carboxylic acid or phosphoric acid group,

A is chosen from the group comprising —HC=CH—, —O—, —S— and when A is —HC=CH— or —S—, then B and C are both —CH—, when A is —O—, then B and C are both —N—, m ranges from 0 to 6, n ranges from 0 to 20, R is chosen from the group comprising hydrogen, linear or branched alkyl with 1 to 20 carbon atoms, hydroxyl, ether, primary, secondary, tertiary or quaternary amine, nitro, cyano, ester;

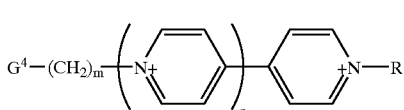

formula (VIII)

in which,

G⁴ is the carboxylate or phosphonate group, n ranges from 0 to 6, m equals 0 or 1, and R is a linear or branched alkyl with 1 to 6 carbon atoms.

In preference, the said dipolar organic compound confers upon the conductive material, to which it is chemically bound via the intermediary of the said functional group, the property of injecting holes into the semiconductor electroluminescent solid organic substance, if it possesses the previous general formula (VII).

In preference again, the said dipolar organic compound confers upon the conductive material, to which it is chemically bound via the intermediary of the said functional group, the property of injecting holes into the semiconducting electroluminescent solid organic substance, if it is 4-nitro-benzoic acid.

In preference, the said dipolar organic compound confers upon the conductive material, to which it is chemically bound via the intermediary of the said functional group, the property of injecting electrons into the semiconductor electroluminescent solid organic substance, if it possesses the previous general formula (VIII).

In preference again, the said dipolar organic compound confers upon the conductive material, to which it is chemically bound via the intermediary of the said functional group, the property of injecting electrons into the semiconducting electroluminescent solid organic substance, if it is 4-carboxy-tri-N-methylaniline betaine or 4-carboxy-1-methylpyridine betaine.

In the electroluminescent device conforming to the invention, the electrically conductive material, in particular of the first electrode, is preferably chosen from among titanium oxide, zinc oxide, tin oxide, gallium nitride and mixed indium and tin oxide. These materials have the great advantage of being transparent to light or translucent. Thus they allow any radiation emitted by the semiconductor electroluminescent solid organic substance to pass through.

In preference again, the said conductive material is mixed indium and tin oxide. It is generally accepted, in the field of solid electroluminescent devices, that the work function of an electrode formed of such material is 4.7 eV. Such an electrode is generally capable of injecting holes, very often with the aid of electrocatalysts.

In the electroluminescent device conforming to the invention, a layer comprising a semiconducting electroluminescent solid organic substance, possibly bordered by one or more intermediate layers consisting of electrocatalysts, is arranged between the two electrodes.

By semiconducting electroluminescent solid organic substance is meant a substance consisting of one or more electroluminescent molecules and possibly including, in a mixture, additives such as dopants of these molecules like fluorophores, electrocatalysts, ionic entities accompanied by ion conductors.

In the electroluminescent device conforming to the invention, the semiconducting electroluminescent solid organic substance is chosen from fluorescent monomer or polymer organic molecules such as molecules belonging to the family of naphthalene, anthracene, coronene, perylene, but also of acridine, rubuene, quinacridone, phthalocyanines, carbazole, derivatives of tris-(8-hydroxyquinoline) compounded with metals such as aluminium, possibly doped by coumarin, or polymeric molecules poly(para-phenylene-vinylene) or poly-(para-phenylene).

The electrocatalysts can be chosen from the derivatives of triphenylamine and oxadiazole, but also poly-(phenyl-vinylene) carrying nitrile groups, polyvinylcarbazole or polymethylphenylsilane.

The second electrode of the device conforming to the invention may consist of a conductive material such as aluminium, silver, copper, magnesium, nickel, titanium or alloys of these metals such as the alloy of magnesium and silver.

One of the great advantages of the electroluminescent device conforming to the invention is that the second electrode of the device may also consist of a transparent or translucent, electrically conductive material, chosen from the metal oxides and metal nitrides, to which a dipolar organic compound would be chemically bound in accordance with one of the variants of the device conforming to the invention. In this case, the [di]polar organic substance will confer on the material of the second electrode the property of injecting charges of an opposite nature to those injected by the first electrode whose material is already chemically bound to a dipolar organic substance of a different nature.

The present invention also relates to dipolar organic compounds for the electroluminescent device conforming to the invention found in the form of organometallic complexes with the following general formulae (I) to (V):

  formula (I), in which,

M is chosen from Ru(II), Os(II), Cr(II), Al(III), Ga(III) and In(III),

L¹ is a ligand with the general formula a), and

L is a ligand with the general formula b);

  formula (II), in which,

M and L¹ are as defined above,

L is a ligand with the general formula b), and
L' is a ligand with the general formula a), c), d) or e);

ML¹LL'    formula (III), in which,
M and L¹ are as defined above,
L and L' are each, independently of one another, a ligand with the general formula a), c), d) or e);

ML¹LL'    formula (IV), in which,
M and L¹ are as defined above,
L is a ligand with the general formula b), and
L' is a ligand with the general formula f);

ML¹L(X)₂    formula (V),

M and L¹ are as defined above,
L is a ligand with the general formula d) or e);
X is chosen from the group of co-ligands comprising Cl⁻, Br⁻, I⁻, NCS⁻, CN⁻, NCO⁻;
the general formulae a), b), c), d) and f) being:

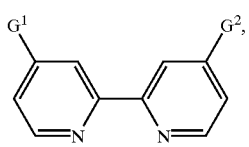

formula a)

in which G¹ and G² are the same or different and are chosen from the group comprising —COOH, —COO⁻, —PO₃H₂, —PO₃H⁻,

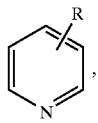

formula b)

in which R is chosen from the group containing hydrogen, phenyl, vinyl, primary, secondary, tertiary or quaternary amine, hydroxyl, alkyl with 1 to 30 carbon atoms;

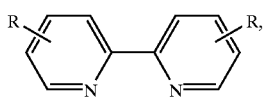

formula c)

in which the Rs are defined, independently of one another, as above;

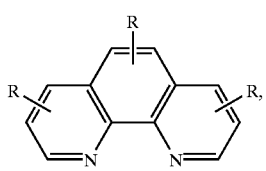

formula d)

in which the Rs are defined, independently of one another, as above;

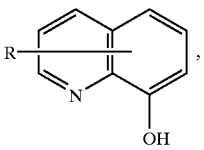

formula e)

in which the Rs are defined, independently of one another, as above;

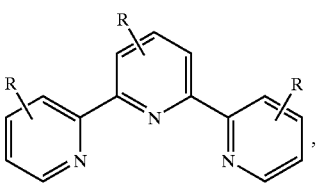

formula f)

in which the Rs are defined, independently of one another, as above.

Generally speaking, the organometallic complexes with general formulae (I) to (VI) are obtained by making the different precursor heterocycles of the ligands L and L' react successively on ruthenium (III) chloride.

The present invention also relates to the dipolar organic compounds for the electroluminescent device conforming to the invention with the following general formula (VII):

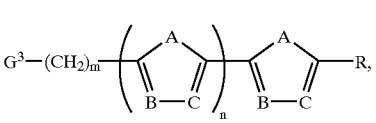

formula (VII)

in which,
G³ is the carboxylic acid or phosphoric acid group,
A is chosen from the group comprising —HC=CH—, —O—, and
when A is —HC=CH—, then B and C are both —CH—,
when A is —O—, then B and C are both —N—,
m ranges from 0 to 6,
n ranges from 0 to 20,
R is chosen from the group comprising hydrogen, linear or branched alkyl with 1 to 20 carbon atoms, hydroxyl, ether, primary, secondary, tertiary or quaternary amine, nitro, cyano, ester.

For the manufacture of the electroluminescent device conforming to the invention, any appropriate process may be used, in particular the techniques employed for the manufacture of the devices of previous art.

Thus, to form the layer consisting of a transparent or translucent, electrically conductive material, chosen from the metal oxides and metal nitrides, the intrinsically known methods of deposition by thermal spraying may be used, in particular by means of a plasma torch, or the techniques of deposition from the liquid phase as well as the processes of deposition by chemical reaction in the vapour phase. The method implementing a plasma torch ("plasma spattering") is especially appropriate for applying the mixed oxide of indium and tin.

In preference, the layer consisting of the conductive material is first formed, by depositing this material on a substrate in the form of a film, a sheet or a plate, and acting as a support for the electroluminescent device. This substrate advantageously consists of a transparent insulating material such as glass, silicon, alumina, preferably sapphire or quartz, or a polymer.

The conductive material is then prepared so as to render its surface active and to enable chemical fixation of the dipolar organic compound. This material then undergoes various cleaning treatments ranging from a treatment by ultrasound, a treatment by mechanical brushing, up to a treatment by ion bombardment or plasma treatment within an enclosure placed under vacuum. The surface layer of the conductive material is then freed of any organic residue as well as any gas absorbed.

For depositing the dipolar organic compound, any technique may be used in which the compound is placed in solution in a solvent. This can be the technique by immersing or "dip-coating" the conductive material in such a dilute solution containing the compound, for sufficient time to allow the bonding of the functional group of the dipolar organic compound onto the organic material. Another technique may also be the application of the procedure known as "spin-coating" in which a small quantity of a dilute solution of the organic compound is deposited on the conductive material which is placed in rotation in order to obtain a uniform distribution of the compound. It is also possible to deposit the dipolar organic compound by applying the technique based on thermal evaporation or sublimation.

In order to obtain a monomolecular layer, the. substrate obtained is rinsed with a pure solvent or else with the same solution containing the dipolar organic compound, but this time of lower concentration. Any molecule which is not bound to the conductive material is then removed.

The layer consisting of the semiconducting electroluminescent solid organic substance, as well as any intermediate layers consisting of electrocatalysts, are successively deposited by applying methods identical to those described above, but this time without necessarily having to use a rinsing stage.

The deposition of the conductive material forming the second electrode is carried out according to intrinsically known methods appropriate to this type of material. For example, if the material is a metal or a metal alloy, it can be deposited according to the technique by thermal evaporation under vacuum. If the material is a metal oxide, it can be deposited by applying either the technique by thermal evaporation under vacuum, or by the "spin-coating" process.

Advantageously, the various constituents of the device are each composed of transparent or translucent materials and the thicknesses of the layers of materials forming the two electrodes, the layer consisting of the semiconductor electroluminescent solid organic substance as well as that of the possible intermediate layers consisting of electrocatalysts, are adjusted so that these layers are all transparent or translucent.

In this way, we can create an electroluminescent device emitting light on both its faces.

We can also, in an intrinsically known manner, optionally form one or more additional auxiliary layers on the outer faces of the device according to the invention, such as reflecting layers, forming a mirror, or semi-transparent and/ or dielectric layers, in order to direct the light emitted by the device or to reinforce it with certain components, especially via the formation of microcavities.

Moreover, we can, by superimposing a plurality of devices according to the invention, for example three, each emitting light on their two faces, these devices comprising layers of different electroluminescent organic materials with different light emission wavelengths, produce a multicoloured display device, functioning through mixtures of colours controlled by varying the voltages applied to the different layers of this device.

A second type of multicoloured display type can be produced with the aid of elements formed by the juxtaposition of a plurality of devices according to the invention, for example three, these devices comprising layers of different electroluminescent organic materials with different light emission wavelengths, functioning through mixtures of colours controlled by varying the voltages applied to the different devices composing each element.

A third type of multicoloured display can be produced with the aid of elements formed by the juxtaposition of a plurality of devices according to the invention, for example three, these devices comprising additional auxiliary layers favouring the selection of a narrow wavelength domain within the light emission spectrum emitted by the electroluminescent organic layer or layers, functioning through mixtures of colours controlled by varying the voltages applied to the different devices composing each element.

The invention will be even better understood thanks to the detailed description which will follow, of non-restrictive examples of the implementation of production forms of the device according to the invention, referring to the appended drawings, in which.

EXAMPLE 1
(Preparation of a first production variant of the device according to the invention, in which the first electrode has the property of injecting holes)

a) Preparation of bis(4,4'-dicarboxy-2,2'-bipyridyl)-ruthenium(II) dichloride dihydrate, a compound with the formula 1a:

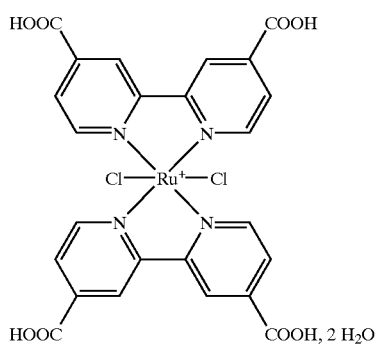

(1a)

The preparation of this ruthenium complex is carried out in accordance with the operating method described in the international application WO 94/04497.

b) Preparation of dithiocyanate of bis-(4,4'dicarboxy-2, 2'-bipyridyl)-ruthenium(II), a compound with the formula 1b.

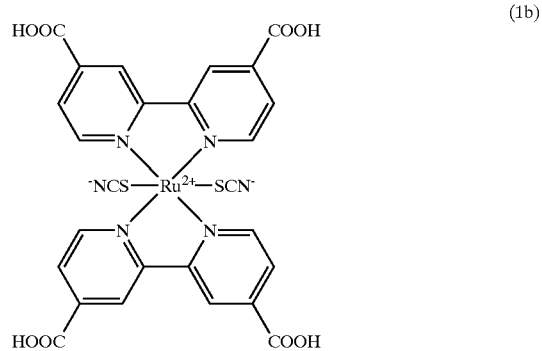

(1b)

Figure 1:
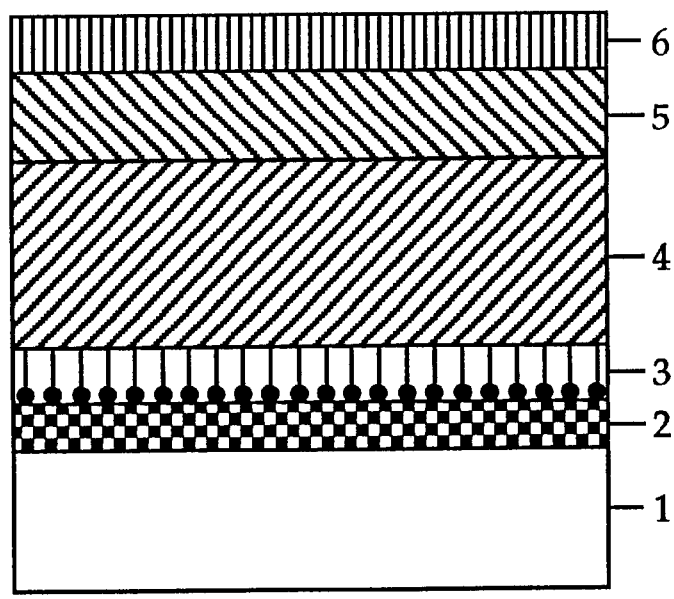
FIG. 1 is a schematic view, in cross-section, of a production form of the device.
Figure 2:
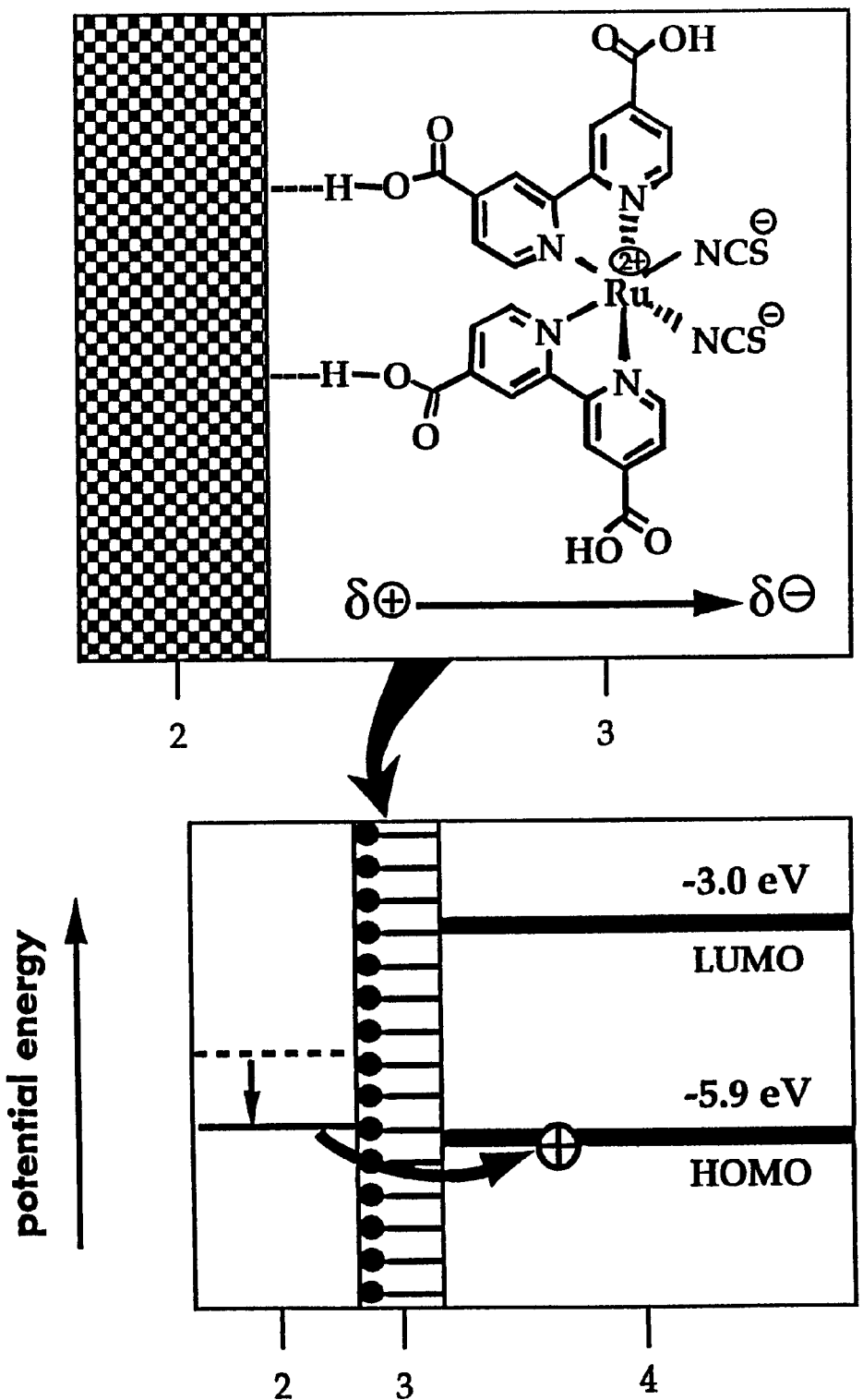
FIG. 2 is a representation of a method of bonding of dithiocyanate of bis-(4,4'dicarboxy-2,2'-bipyridyl)-ruthenium(II), a dipolar substance conferring on the material the property of injecting holes, accompanied by the representation of its electrical dipole moment together with a symbolic representation of the different energy levels.

The preparation of this ruthenium complex is carried out in accordance with the operating method described in the international application WO 94/04497. The evaluated absolute value of the electrical dipole moment of this complex is 10 Debye units.

c) Preparation of the variant of the device according to the invention as illustrated in FIG. 1.

A glass plate 1, covered with a thin conducting layer of mixed indium and tin oxide (a commercial product referred to as ITO) with a thickness of 80 nm and an electrical resistivity of 50 Ω, is cleaned in an ultrasonic bath in ethyl alchol, then in acetone before being mechanically scrubbed in distilled water containing a surfactant, with a polymer-based brush. Another cleaning operation is carried out in an ultrasonic bath containing a detergent, then in distilled water. The substrate thus cleaned is then introduced into a glove box, placed in an argon atmosphere, connected to a vacuum chamber. It is then subjected to an ion bombardment for 6 minutes under an argon pressure of $8.10^{-2}$ mbar, a voltage of 120 volts, and an RF power of 10 W. Without leaving the inert atmosphere, the conductive substrate is dipped in an ethyl alcohol solution, free of water and oxygen, containing dithiocyanate of bis-(4,4'dicarboxy-2,2'-bipyridyl)-ruthenium(II) at a concentration of $10^{-4}$ M. The substrate is then quickly rinsed in the same ethyl alcohol solution, this time at a concentration of $10^{-6}$ M. Layer 3 of monomolecular structure is thus formed. The substrate is again placed in a vacuum chamber, a layer with a thickness of 140 nm consisting of tris-(8-hydroxyquinoline) of aluminium is then deposited by thermal evaporation. Finally, the second electrode consisting of aluminium is deposited in the form of a layer 6 with a thickness of 50 nm according to an intrinsically known method. An electric current is applied between the positive terminal connected to the first electrode, consisting of indium and tin oxide onto which the dipolar organic compound has been chemically bound, and the negative terminal to the second electrode, consisting of aluminium.

Figure 3:
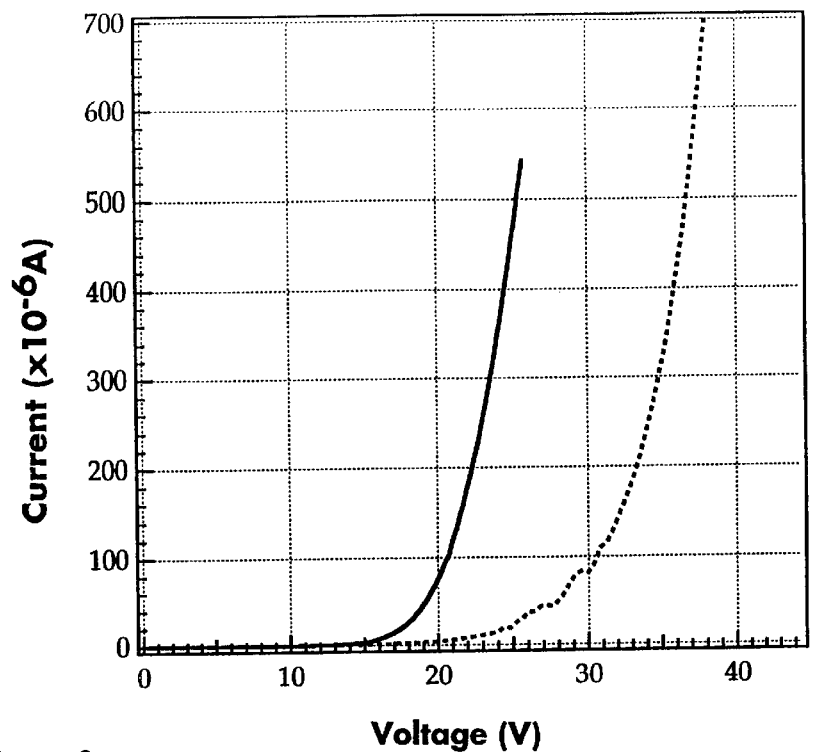
FIG. 3 is a diagram showing the current-voltage characteristic curve as a continuous line obtained with, as the electroluminescent substance, tris-(8-hydroxyquinoline) of aluminium, binding dithiocyanate of bis-(4,4'dicarboxy-2,2'-bipyridyl)-ruthenium(II) to an electrode; the dotted line curve is the reference curve obtained without binding the compound.
Figure 4:
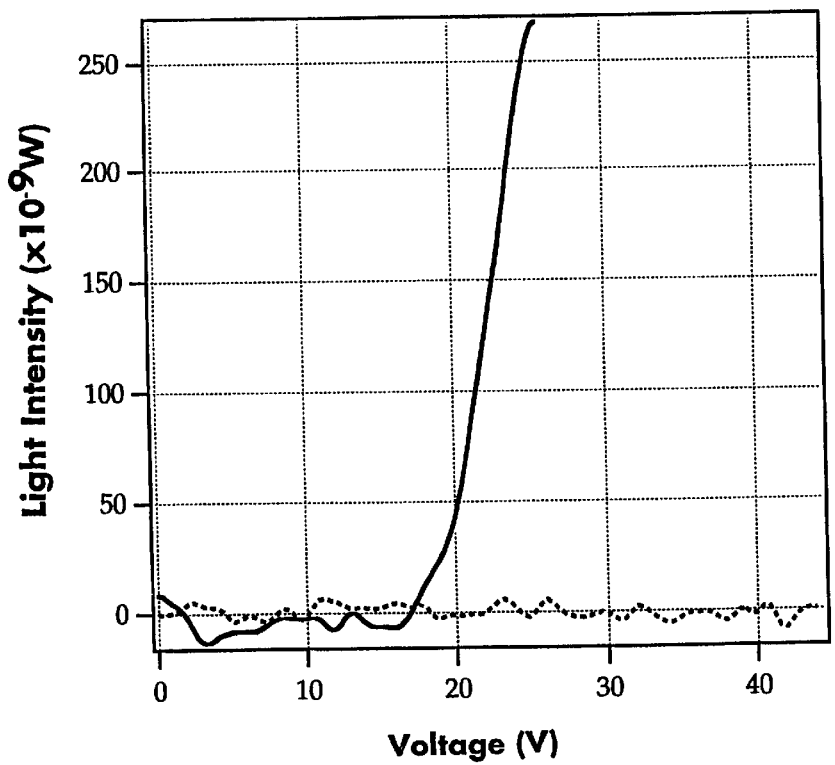
FIG. 4 is a diagram showing the light intensity-voltage characteristic curve as a continuous line obtained with, as the electroluminescent substance, tris-(8-hydroxyquinoline) of aluminium, binding dithiocyanate of bis-(4,4'dicarboxy-2,2'-bipyridyl)-ruthenium(II) to an electrode, the dotted line curve is the reference curve obtained without binding the compound.
Figure 5:
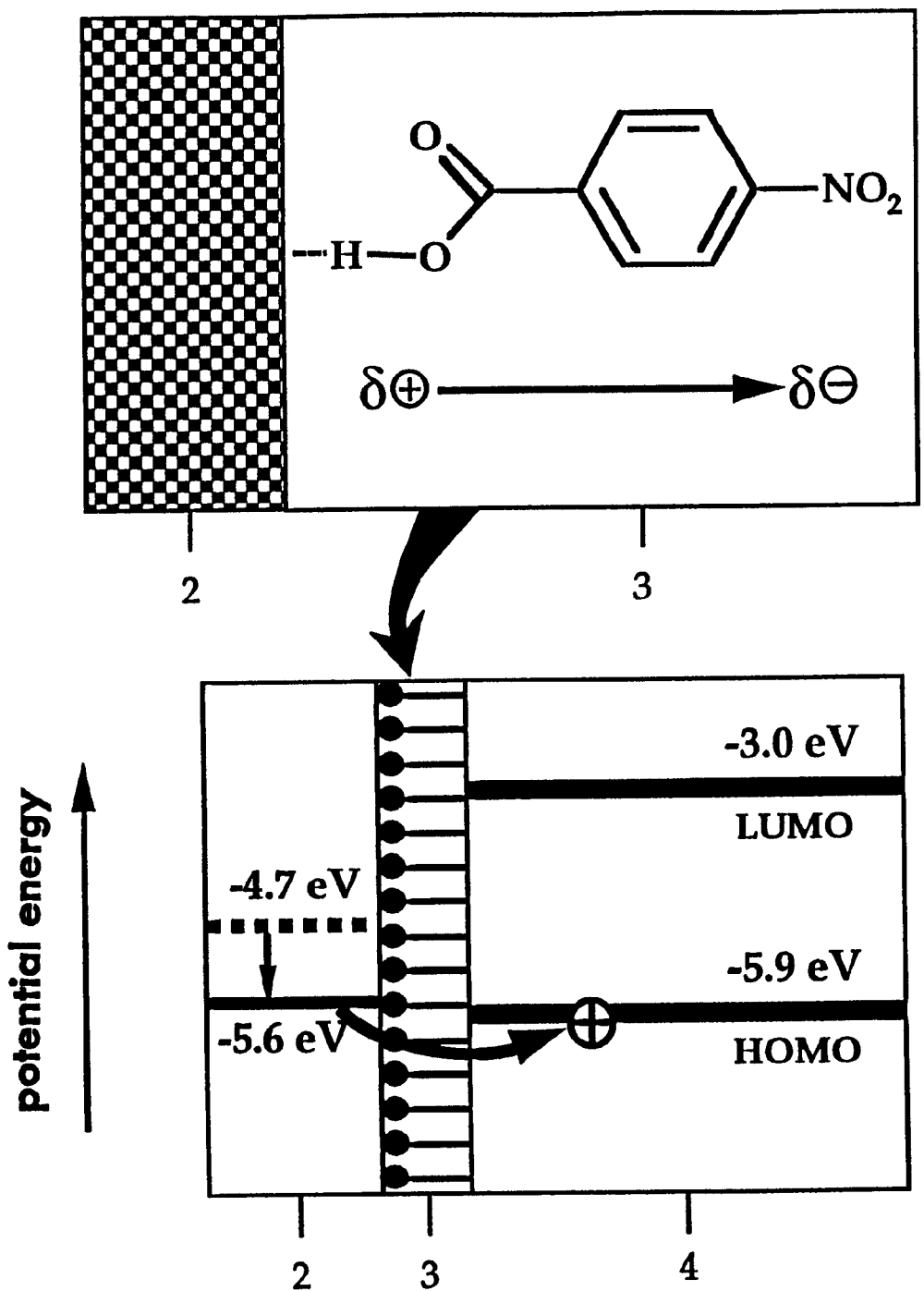
FIG. 5 is a representation of a method of bonding 4-nitrobenzoic acid, a dipolar substance conferring on the material the property of injecting holes, accompanied by the representation of its electrical dipole moment as well as a symbolic representation of the different energy levels.

The characteristics obtained are presented in FIGS. 3 and 4 and compared to those obtained when the organic compound has not been bound to the electrode material. It is very clearly seen that the first electrode injects holes, for increasing voltage values, starting from +20 V only. This current flow is then accompanied by a striking emission of light whose intensity then only increases. As for the reference device, it is not capable of injecting holes at such a voltage and obviously cannot emit light.

EXAMPLE 2
(Preparation of a second production variant of the device according to the invention, in which the first electrode has the property of injecting holes)

An example has been made of a similar device to that of the previous variant. This time, the dipolar organic compound forming layer 3 of a monomolecular thickness is 4-nitrobenzoic acid. The evaluated absolute value of its electrical dipole moment is 5 Debye units.

Thus a solution of this acid in tetrahydrofurane at a concentration of $10^{31\ 3}$ M is deposited on the conductive substrate in an inert atmosphere. After several hours of contact, the substrate is rinsed with the tetrahydrofurane then dried. Layer 4 consists of tris-(8-hydroxyquinoline) of aluminium with a thickness of 140 nm. An electric current is applied between the positive terminal connected to the first electrode, consisting of indium and tin oxide onto which the dipolar organic compound has been chemically bound, and the negative terminal to the second electrode, consisting of aluminium.

Figure 6:
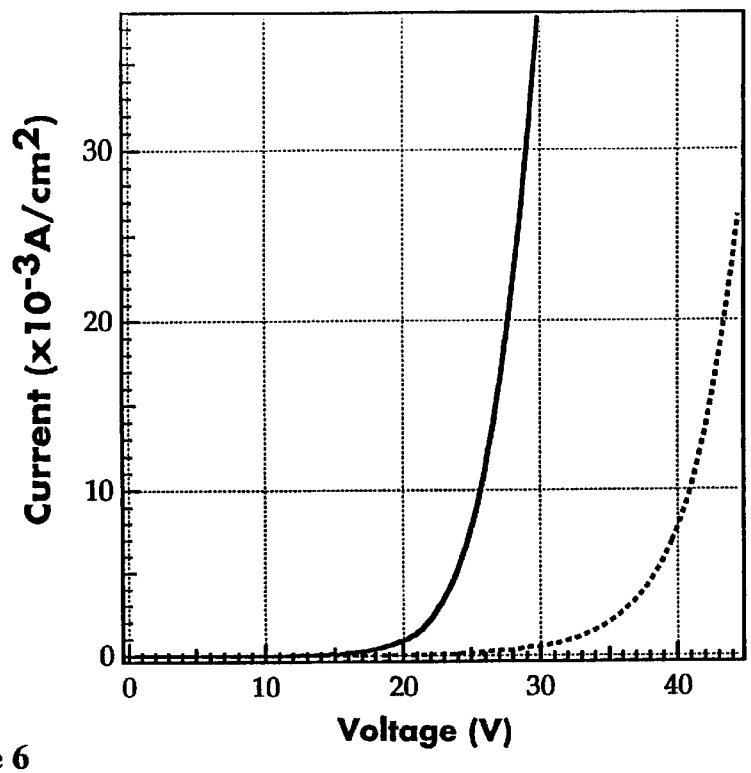
FIG. 6 is a diagram showing the current-voltage characteristic curve as a continuous line obtained with, as the electroluminescent substance, tris-(8-hydroxyquinoline) of aluminium, binding 4-nitrobenzoic acid to an electrode; the dotted line curve is the reference curve obtained without binding the compound.
Figure 7:
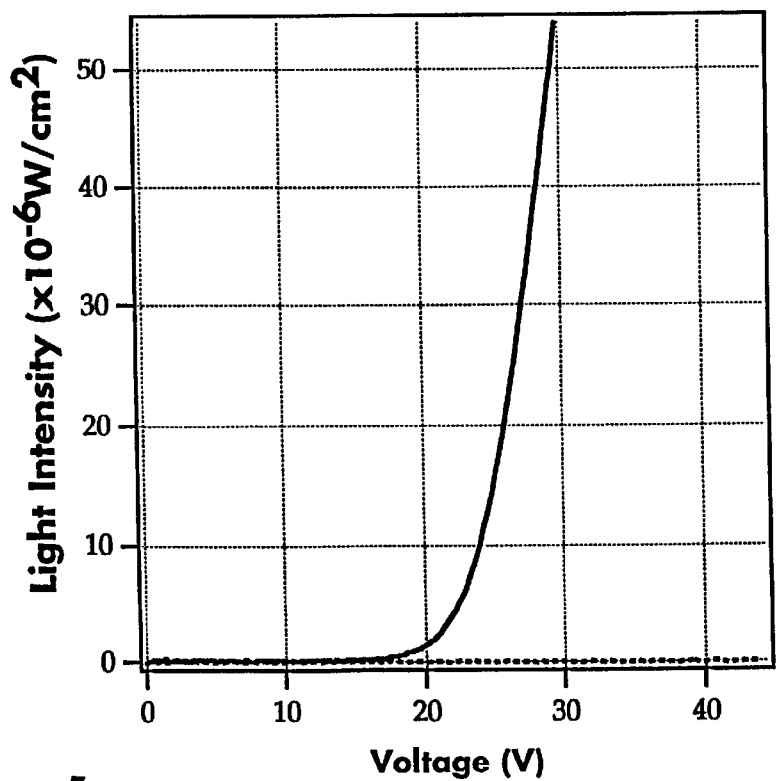
FIG. 7 is a diagram showing the light intensity-voltage characteristic curve as a continuous line obtained with, as the electroluminescent substance, tris-(8-hydroxyquinoline) of aluminium, binding 4-nitrobenzoic acid to an electrode; the dotted line curve is the reference curve obtained without binding the compound.

The characteristics obtained are presented in FIGS. 6 and 7 and compared to those obtained when the organic compound has not been bound to the electrode material. It is very clearly seen that the first electrode only injects holes, for increasing voltage values, starting from +20 V. This current flow is then accompanied by a striking emission of light whose intensity then only increases. As for the reference device, it is not capable of injecting holes at such a voltage and obviously cannot emit light.

EAXMPLE 3
(Preparation of a third production variant of the device according to the invention, in which the first electrode has the property of injecting holes)

a) Preparation of the 2,2'-5',2''-5'', 2'''-tetrathienyl-5'''-carboxylic acid, a compound with the formula 3a:

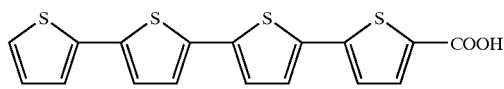

(3a)

The preparation of this compound is carried out according to the operating method described by S. Isz et al. (AIP Conference Proceeding, Ed. P. C. Lacaze, AIP Press, New York, 1996, Vol. 354, pp 394–408). The evaluated absolute value of its electrical dipole moment is 2.5 Debye units.

b) Preparation of the variant of the device according to the invention as illustrated in FIG. 1.

An example has been made of a similar device to that of the previous variant, but this time the dipolar organic compound forming layer 3 is 2,2'-5', 2''-5'', 2'''-tetrathienyl-5'''-carboxylic acid.

An electric current is then applied between the positive terminal connected to the first electrode, consisting of indium and tin oxide onto which the dipolar organic compound has been chemically bound, and the negative terminal to the second electrode.

It is very clearly seen that the first electrode only injects holes, for increasing voltage values, starting from +22 V. This current flow is then accompanied by a striking emission of light whose intensity then only increases. As for the reference device, it is not capable of injecting holes at such a voltage and obviously cannot emit light.

EXAMPLE 4
(Preparation of a fourth production variant of the device according to the invention, in which the first electrode has the property of injecting holes)

a) Preparation of N,N'-dioctyl-3,3'-bicarbazyl-6,6'-gdicarboxylic acid, a compound with the formula 4a:

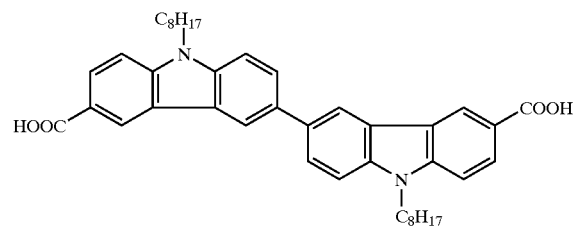

(4a)

The preparation of this compound is carried out according to the operating method described by T. Benazzi (Thesis submitted for obtaining a doctor's degree at the University of Paris-Nord, 1997). The evaluated absolute value of its electrical dipole moment is 3 Debye units.

b) Preparation of the variant of the device according to the invention as illustrated in FIG. 1.

An example has been made of a similar device to that of the previous variant. This time, the dipolar organic compound forming layer 3 of a monomolecular thickness is N,N'-dioctyl-3,3'-bicarbazyl-6,6'-dicarboxylic acid, the electroluminescent substance is N,N'-diethyl-3,3'-bicarbazole and the second electrode consists of an alloy of magnesium and silver.

Thus a solution of this acid in tetrahydrofurane at a concentration of $10^{-4}$ M is deposited by dip-coating onto the conductive substrate in an inert atmosphere. After 10 hours of contact, the substrate is rinsed with the tetrahydrofurane then dried. Layer 4 consists of N,N'-diethyl-3,3'-bicarbazole with a thickness of 100 nm. An electric current is applied between the positive terminal connected to the first electrode, consisting of indium and tin oxide onto which the dipolar organic compound has been chemically bound, and the negative terminal to the second electrode.

Figure 8:
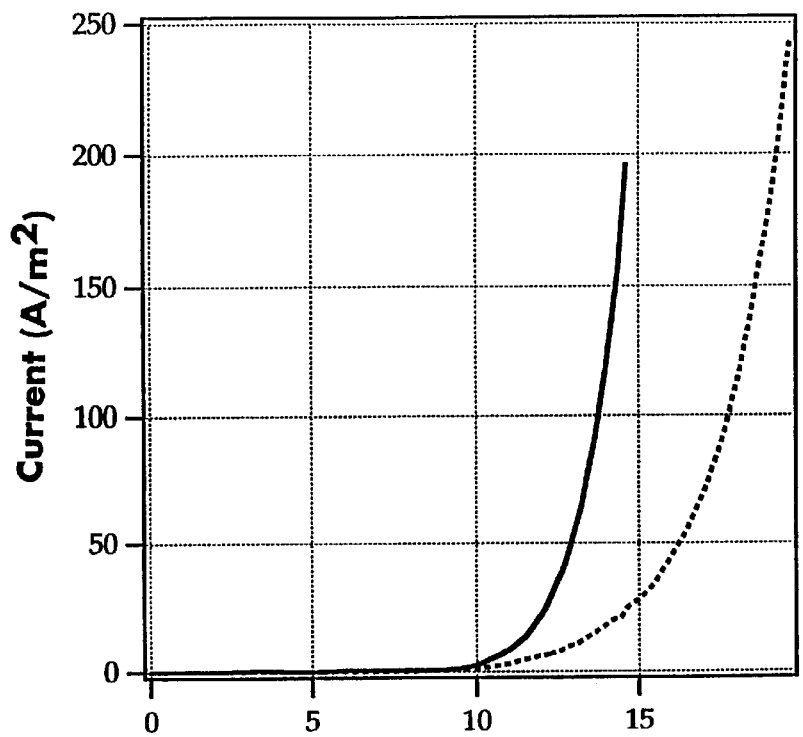
FIG. 8 is a diagram showing the current-voltage characteristic curve as a continuous line obtained with, as the electroluminescent substance N,N'-diethyl-3,3'-bicarbazole, binding N,N'-dioctyl-3,3'-bicarbazyl-6,6'-dicarboxylic acid to an electrode; the dotted line curve is the reference curve obtained without binding the compound.
Figure 9:
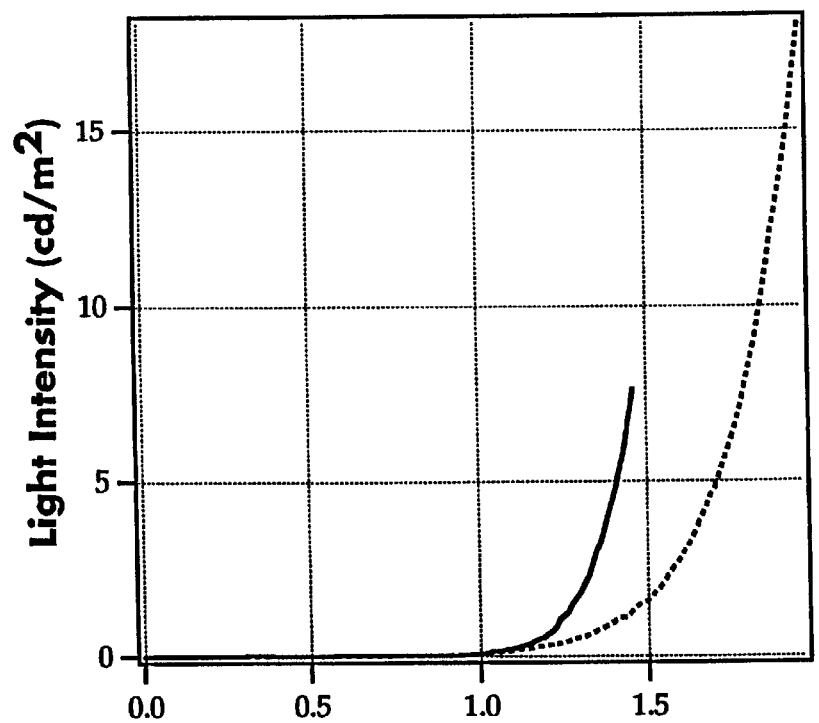
FIG. 9 is a diagram showing the light intensity-voltage characteristic curve as a continuous line obtained with, as the electroluminescent substance, N,N'-diethyl-3,3'-bicarbazole, binding N,N'-dioctyl-3,3'-bicarbazyl-6,6'-dicarboxylic acid to an electrode; the dotted line curve is the reference curve obtained without binding the compound.

The characteristics obtained are presented in FIGS. 8 and 9 and compared to those obtained when the organic compound has not been bound to the electrode material. It is very clearly seen that the first electrode injects holes, for increasing voltage values, starting from +13 V only. This current flow is then accompanied by a striking emission of light whose intensity then only increases. As for the reference device, it is not capable of injecting holes at such a voltage and obviously cannot emit light.

EXAMPLE 5

(Preparation of a fifth production variant of the device according to the invention, in which the first electrode has the property of injecting electrons)

a) Preparation of (4,4'-diphenyl-1,10-phenanthrolene) ruthenium(II) dichloride, a compound with the formula 5a:

(5a)

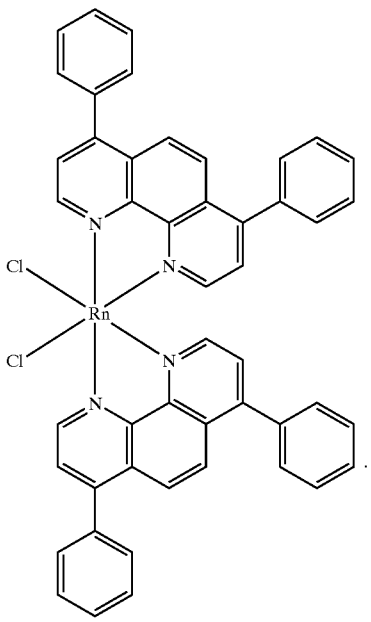

The preparation of this compound is carried out according to the operating method described by Y. Athanassov et al. (J. Phys. Chem. B, 1997, 101, 2558).

b) Preparation of [bis-(4,4'-diphenyl-1,10-phenanthrolene)-(4,41-dicarboxy-2,2'-bipyridyl)]ruthenium(II), a compound with the formula 5b:

(5b)

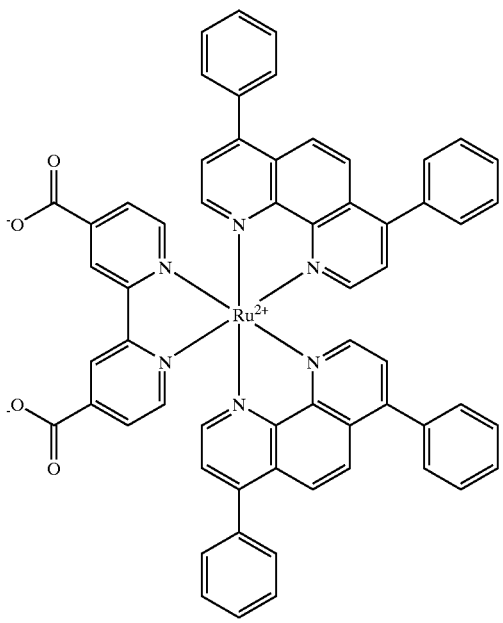

To a mixture of 10 ml of water/ethyl alcohol (1:1), is added (4,4'-diphenyl-1,10-phenanthrolene)ruthenium(II) dichloride (167 mg, 0.2 mmol), 2,2'bipyridyl-4,4'-dicarboxylic acid (49.5 mg, 0.202 mmol) and approximately 50 mg of triethylamine. The mixture is brought to reflux for 3 hours under nitrogen. After cooling, the solution is filtered in order to remove the insoluble impurities and the ethyl alcohol is evaporated. The precipitate is collected by filtering and washed with water. The raw product is placed in some acetone which is brought to reflux for 2 to 3 hours. After cooling, the product is filtered. The elementary analysis for $C_{60}H_{53}N_6S_2O_{11.5}Ru$ gives: C62.82(63.04); H4.67(4.67); N7.36(7.35), the calculated values are in parentheses.

The evaluated absolute value of its electrical dipole moment is 50 Debye units.

c) Preparation of the variant of the device according to the invention as illustrated in FIG. 1.

A device was made similar to those of the preceding variants, differing, however, by the introduction of an additional layer 5 of electrocatalysts. This time, the dipolar organic compound forming layer 3 of a monomolecular thickness is [bis-(4,4'-diphenyl-1,10-phenanthrolene)-(4,4'-dicarboxy-2,2'-bipyridyl)]ruthenium(II). The conductive substrate is dipped in an ethyl alcohol solution of this compound at a concentration of $10^{-4}$ M in an inert atmosphere. After several hours of contact, the substrate is rinsed with the same ethyl alcohol solution, this time at a concentration of $10^{-6}$ M. The substrate is then placed in a vacuum chamber, a layer with a thickness of 90 nm of tris-(8-hydroxyquinoline) of aluminium is then deposited for thermal evaporation. A second intermediate layer 5 consists of N,N'-bis(3-methylphenyl)-N,N'-(biphenyl)benzidine with a thickness of 50 nm. Finally, the second electrode consisting of gold is deposited in the form of a layer 6 with a thickness of 50 nm according to an intrinsically known method. An electric current is applied between the positive terminal connected to the first electrode, consisting of indium and tin oxide onto which the dipolar organic compound has been chemically bound, and the negative terminal to the second electrode, consisting of gold.

Figure 10:
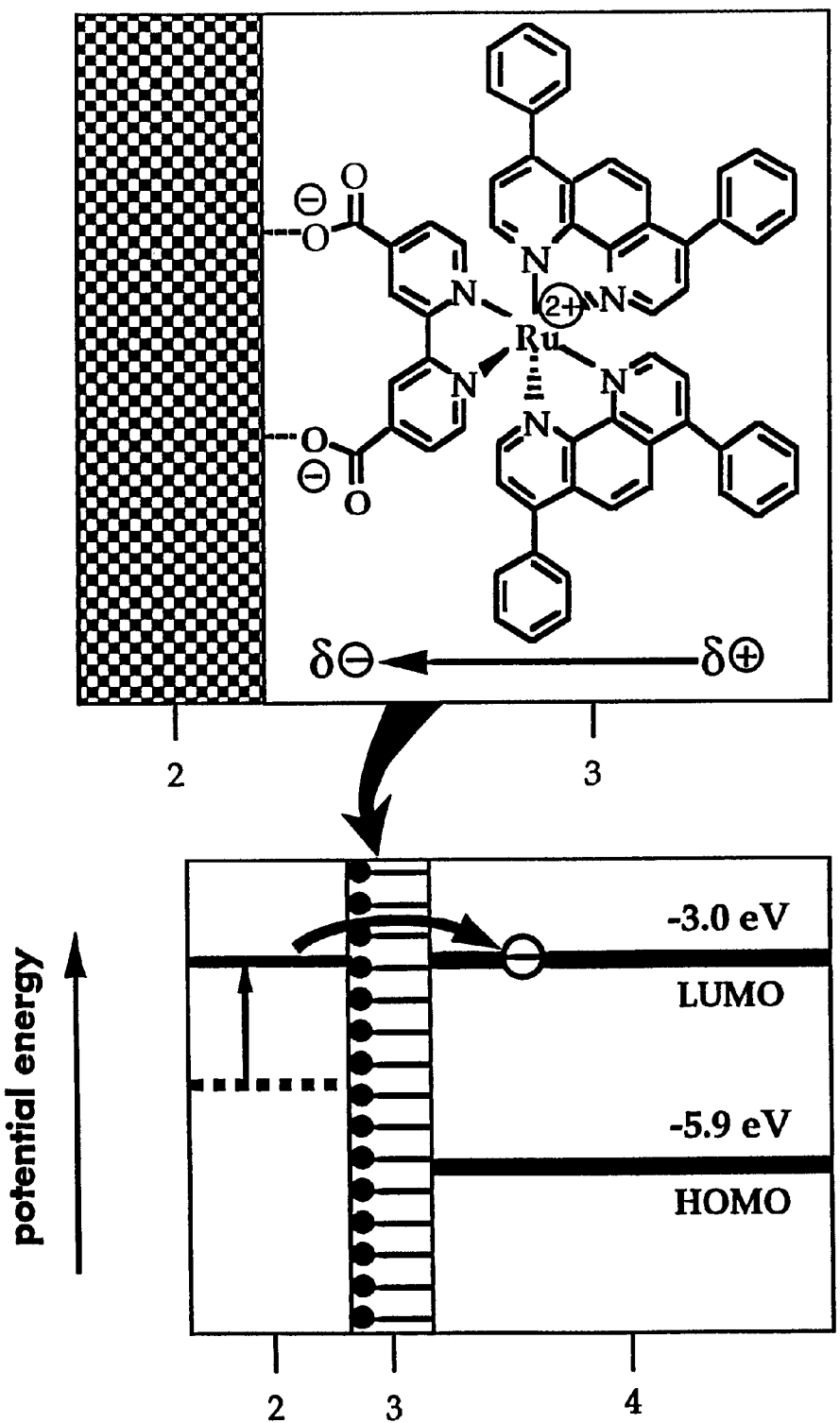
FIG. 10 is a representation of a method of bonding [bis-(4,4'-diphenyl-1,10-phenanthrolene)-(4,4'-dicarboxy-2,2'-bipyridyl)]ruthenium(II), a dipolar substance conferring on the material the property of injecting electrons, accompanied by the representation of its electrical dipole moment, as well as a symbolic representation of the different energy levels.
Figure 11:
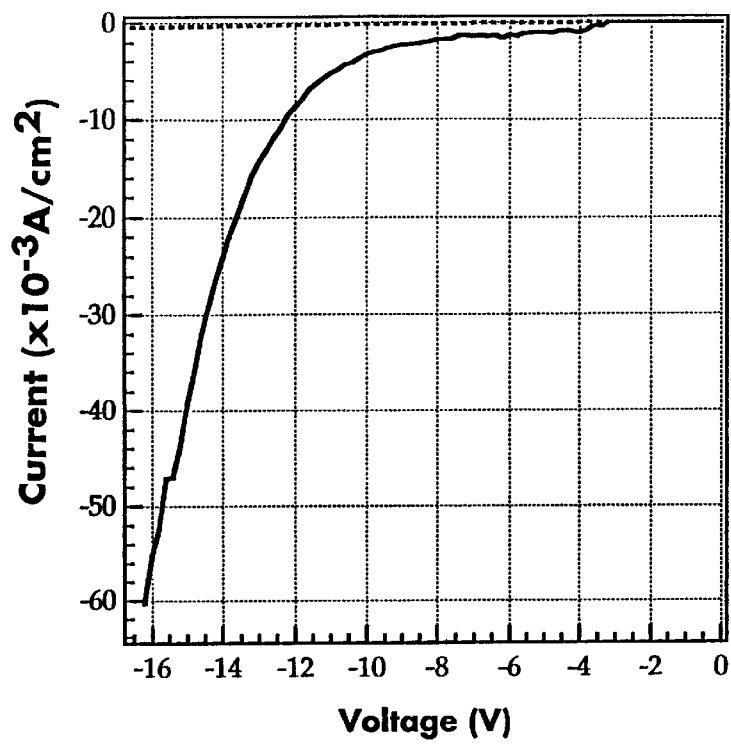
FIG. 11 is a diagram showing the current-voltage characteristic curve as a continuous line obtained with, as the electroluminescent substance, tris-(8-hydroxyquinoline) of aluminium, binding [bis-(4,4'-diphenyl-1,10-phenanthrolene)-(4,4'-dicarboxy-2,2'-bipyri-dyl)]ruthenium(II) to an electrode; the dotted line curve is the reference curve obtained without binding the compound.
Figure 12:
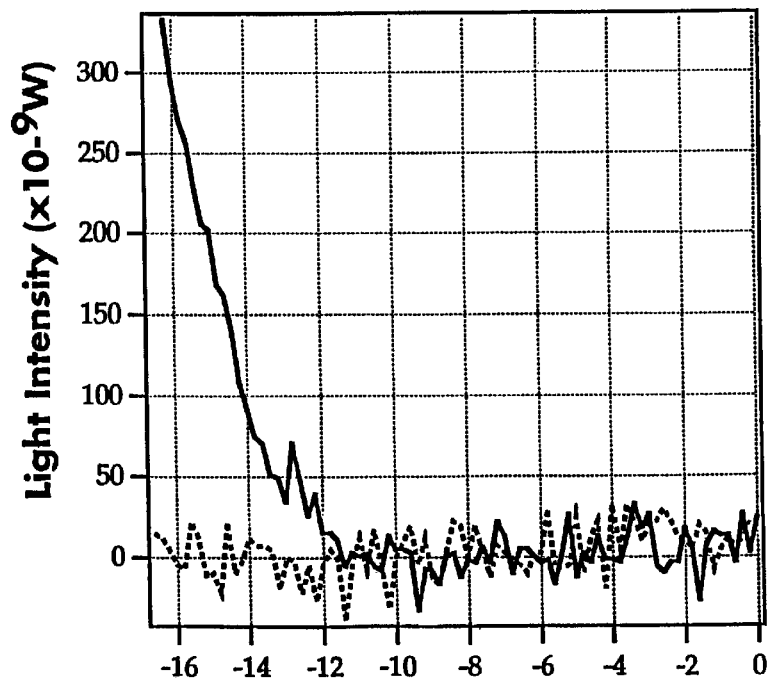
FIG. 12 is a diagram showing the light intensity-voltage characteristic curve as a continuous line obtained with, as the electroluminescent substance, tris-(8-hydroxyquinoline), binding [bis-(4,4'-diphenyl-1,10-phenanthrolene)-(4,4'-dicarboxy-2,2'-bipyridyl)]ruthenium(II) to an electrode; the dotted line curve is the reference curve obtained without binding the compound.

The characteristics obtained are presented in FIGS. 10 and 11 and compared to those obtained when the organic compound has not been bound to the electrode material. It is very clearly seen that the first electrode injects electrons, for decreasing voltage values, starting from –10 V only. This current flow is then accompanied by a striking emission of light whose intensity then only increases. As for the reference device, it is not capable of injecting electrons and obviously cannot emit light.

EXAMPLE 6

(Preparation of a sixth production variant of the device according to the invention, in which the first electrode has the property-of injecting electrons)

a) Preparation of the compound of bipyridinium structure as represented by the formula 6a:

(6a)

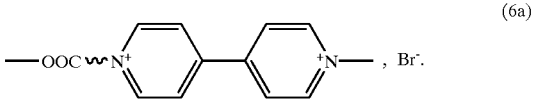

The preparation of this compound is carried out according to the operating method described by J. Emon (Anal. Chem., 1986, 58, 1866). The evaluated absolute value of its electrical dipole moment is 30 Debye units.

b) Preparation of the variant of the device according to the invention as illustrated in FIG. 1.

An example has been made of a similar device to that of the previous variant, but this time the dipolar organic compound forming layer 3 is the compound of bipyridinium structure as represented by the formula 6a.

An electric current is applied between the positive terminal connected to the first electrode, consisting of indium and tin oxide onto which the dipolar organic compound has been chemically bound, and the negative terminal to the second electrode, consisting of gold. The first electrode injects electrons, for decreasing voltage values, starting from −13 V only. As for the reference device, it is not capable of injecting electrons and obviously cannot emit light.

EXAMPLE 7

(Preparation of a seventh production variant of the device according to the invention, in which the first electrode has the property of injecting electrons)

a) Preparation of 4-carboxy-tri-N-methylaniline betaine, a compound with the formula 7a:

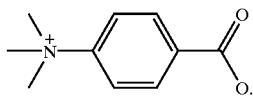

(7a)

The preparation of this compound is carried out in accordance with the operating method described by K. Willstaetten et al. (Chem. Ber., 1904, 37, 415). The evaluated absolute value of its electrical dipole moment is 20 Debye units.

b) Preparation of the variant of the device according to the invention as illustrated in FIG. 1.

An example of a device similar to that of the previous variant has been produced, but this time the dipolar organic compound forming layer 3 is 4-carboxy-tri-N-methylaniline betaine.

An electric current is applied between the positive terminal connected to the first electrode, consisting of indium and tin oxide onto which the dipolar organic compound has been chemically bound, and the negative terminal to the second electrode, consisting of gold. The first electrode injects electrons, for decreasing voltage values, starting from −13 V only. This current flow is then accompanied by a striking emission of light whose intensity then only increases. As for the reference device, it is not capable of injecting electrons and obviously cannot emit light.

EXAMPLE 8

(Preparation of an eighth production variant of the device according to the invention, in which the first electrode has the property of injecting electrons).

a) Preparation of 4-carboxy-1-methylpyridine betaine, a compound with the formula 8a:

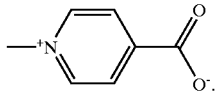

(8a)

The preparation of this compound is carried out in accordance with the operating method described by Black (J. Phys. Chem., 1955, 59, 670). The evaluated absolute value of its electrical dipole moment is 15 Debye units.

b) Preparation of the variant of the device according to the invention as illustrated in FIG. 1.

An example of a device similar to that of the previous variant has been produced, but this time the dipolar organic compound forming layer 3 is 4-carboxy-1-methylpyridine betaine.

An electric current is applied between the positive terminal connected to the first electrode, consisting of indium and tin oxide onto which the dipolar organic compound has been chemically bound, and the negative terminal to the second electrode, consisting of gold. The first electrode injects electrons, for decreasing voltage values, starting from −15 V only. This current flow is then accompanied by a striking emission of light whose intensity then only increases. As for the reference device, it is not capable of injecting electrons and obviously cannot emit light.

EXAMPLE 9

(Preparation of a reference device in which a electrode consisting of indium and tin oxide is not capable of injecting sufficient holes or sufficient electrons.)

A glass plate 1, covered with a thin conducting layer of mixed indium and tin oxide is cleaned as in example 1. The substrate is then introduced into a glove box placed in an argon atmosphere, connected to a vacuum chamber. It is then subjected to an ion bombardment for 6 minutes under an argon pressure of $8.10^{-2}$ mbar, a voltage of 120 V, and an RF power of 10 W. Without leaving the inert atmosphere, the conductive substrate is dipped in ethyl alcohol free of water and oxygen and is then dried. The substrate is again placed in a vacuum chamber; a layer with a thickness of 140 nm consisting of tris-(8-hydroxyquinoline) of aluminium is then deposited by thermal evaporation. Finally, the second electrode consisting of aluminium is deposited in the form of a layer 6 with a thickness of 50 nm according to an intrinsically known method. An electric current is applied between the positive terminal connected to the first electrode, consisting of indium and tin oxide, and the negative terminal to the second electrode, consisting of aluminium.

EXAMPLE 10

(Preparation of a reference device in which an electrode consisting of indium and tin oxide is not capable of injecting either sufficient holes or sufficient electrons.)

An example of a reference device similar to the previous one has been produced. This time, the semiconductor electroluminescent solid organic substance is N,N'-diethyl-3,3'-bicarbazole, replacing the tris-(8-hydroxyquinoline) of aluminium and the second electrode is made of an alloy of magnesium and silver.

What is claimed is:

1. An electroluminescent device with a multilayer structure comprising:

i) a first electrode including a layer consisting of a transparent or translucent, electrically conductive material, chosen from among the metal oxides and metal nitrides, the said layer being deposited on a transparent support selected from the group consisting of glass, silicon, alumina plates and polymer sheets;

ii) a second electrode;

iii) a layer comprising a semiconducting, electroluminescent, solid, organic substance, the said layer being arranged between the two electrodes; and iv) a layer of monomolecular structure, arranged between the layer consisting of the conductive material and the layer comprising the electroluminescent organic substance;

wherein the said layer of monomolecular structure consists of a dipolar organic compound whose structure comprises at least one electronic system π, said structure comprising at least one functional group, the said dipolar organic compound on the one hand being chemically bound by at least one said functional group to the said conductive material and, on the other, having a chemical affinity for the said electroluminescent organic substance;

wherein said dipolar organic compound forming said layer of monomolecular structure has an electrical dipole moment represented by a vector, whose absolute value is between 1 Debye unit and 50 Debye units and whose orientation is such that the negative pole of the said compound is in the vicinity of the conductive material to which it is chemically bound, whilst the positive pole of the said compound is spaced away from the said material, whereby the first electrode has the property of injecting electrons into the layer consisting of the electroluminescent organic substance; and wherein the said dipolar organic compound is an organometallic complex with one of the following general formulae (I) to (IV):

      formula (I), in which,

M is selected from the group consisting of Ru(II), Os(II), Cr(II), Al(III), Ga(III) and In(III), $L^1$ is a ligand with the general formula a), and L is a ligand with the general formula b);

      formula (II), in which,

M and $L^1$ are as defined above,

L is a ligand with the general formula b), and

L' is a ligand with the general formula a), c), d) or e);

      formula (III), in which,

M and $L^1$ are as defined above,

L and L' are each, independently of one another, a ligand with the general formula a), c), d) or e);

      formula (IV), in which,

M and $L^1$ are as defined above,

L is a ligand with the general formula b), and

L' is a ligand with the general formula f);

the general formulae a), b), c), d) and f) being:

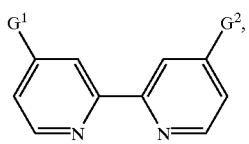

formula a)

in which $G^1$ and $G^2$ are the same or different and are selected from the group consisting of —COOH, —COO⁻, —PO₃H₂, and —PO₃H⁻;

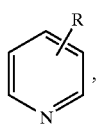

formula b)

in which R is selected from the group consisting of hydrogen, phenyl, vinyl, primary, secondary, tertiary, quaternary amine, hydroxyl, and alkyl with 1 to 30 carbon atoms;

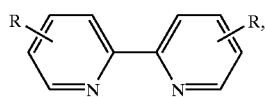

formula c)

in which the Rs are defined, independently of one another, as above;

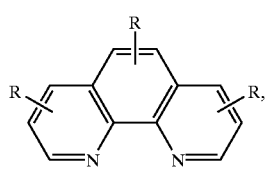

formula d)

in which the Rs are defined, independently of one another, as above;

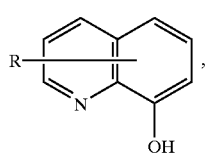

formula e)

in which the Rs are defined, independently of one another, as above;

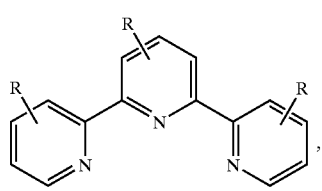

formula f)

in which the Rs are defined, independently of one another, as above.

2. An electroluminescent device according to claim 1, wherein the dipolar organic compound is (bis-(4,4'-diphenyl-1,10-phenanthrolene)-(4,4'-dicarboxy-2,2'-bipyridyl)) ruthenium(II) in the form of an internal salt.

3. An electroluminescent device with a multilayer structure comprising:

i) a first electrode including a layer consisting of a transparent or translucent, electrically conductive material, chosen from among the metal oxides and metal nitrides, the said layer being deposited on a transparent support, selected from the groups consisting of glass, silicon, alumina plates and polymer sheets;

ii) a second electrode;

iii) a layer comprising a semiconducting, electroluminescent, solid, organic substance, the said layer being arranged between the two electrodes; and iv) a layer of monomolecular structure, arranged between the layer consisting of the conductive material and the said layer comprising the electroluminescent organic substance;

wherein the said layer of monomolecular structure consists of a dipolar organic compound, in the form of an organometallic complex with one of the following general formulae (V) and (VI):

 formula (V), in which,

M is selected from the group consisting of Ru(II), Os(II), Cr(II), Al(III), Ga(III) and In(III), $L^1$ is a ligand with the general formula a), L is a ligand with the general formula a), c), d) or e), X is selected from the group of co-ligands consisting of Cl⁻, Br⁻, I⁻, NCS⁻, CN⁻, and NCO⁻; and

 formula (VI), in which

M, $L^1$ and X are as defined above,

L is a ligand with the general formula f);

the general formulae a), c), d), e), f) being:

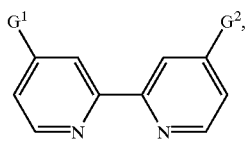 formula a)

in which $G^1$ and $G^2$ are the same or different and are selected from the group consisting of —COOH, —COO⁻, —PO₃H₂, and —PO₃H⁻,

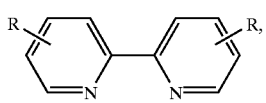 formula c)

in which the Rs are selected, independently of one another, from the group consisting of hydrogen, phenyl, vinyl, primary, secondary, tertiary, quaternary amine, hydroxyl, and alkyl with 1 to 30 carbon atoms;

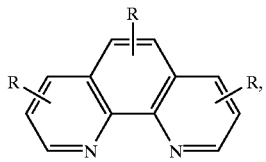 formula d)

in which the Rs are defined, independently of one another, as above;

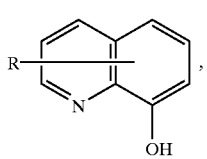 formula e)

in which the Rs are defined, independently of one another, as above;

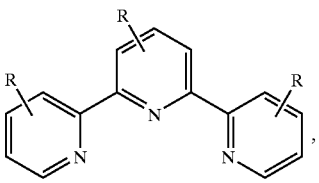 formula f)

in which the Rs are defined, independently of one another, as above, whereby the said first electrode has the property of injecting holes into the said layer comprising the electroluminescent organic substance.

4. An electroluminescent device as claimed in claim 3, wherein the said layer comprising said electroluminescent organic substance is an ion conductor.

5. An electroluminescent device as claimed in claim 3, comprising one or more additional intermediate layers consisting of electrocatalysts.

6. An electroluminescent device according to claim 3, wherein the dipolar organic compound is dithiocyanate of bis-(4,4'dicarboxy-2,2'-bipyridyl)-ruthenium(II) in the tetra-acid form.

7. An electroluminescent device according to claim 3, wherein the conductive material is selected from the group consisting of titanium oxide, zinc oxide, tin oxide, gallium nitride and mixed indium and tin oxides.

8. A dipolar organic compound with one of the following general formulae (I), (II), (IV):

 formula (I), in which,

M is selected from Ru(II), Os(II), Cr(II), Al(III), Ga(III) and In(III), $L^1$ is a ligand with the general formula a), and L is a ligand with the general formula b);

 formula (II), in which,

M and $L^1$ are as defined above,

L is a ligand with the general formula b), and L' is a ligand with the general formula a), c), d) or e);

 formula (IV), in which,

M and $L^1$ are as defined above,

L is a ligand with the general formula b), and

L' is a ligand with the general formula f);

the general formulae a), b), c), d), e) and f) being:

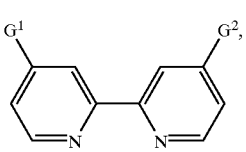 formula a)

in which $G^1$ and $G^2$ are the same or different and are selected from the group consisting of —COOH, —COO⁻, —PO₃H₂, and —PO₃H⁻,

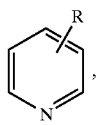
formula b)

in which R is selected from the group consisting of hydrogen, phenyl, vinyl, primary, secondary, tertiary quaternary amine, hydroxyl, and alkyls with 1 to 30 carbon atoms;

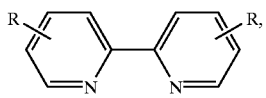
formula c)

in which the Rs are defined, independently of one another, as above;

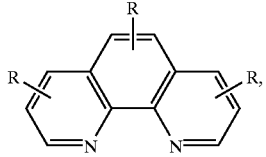
formula d)

in which the Rs are defined, independently of one another, as above;

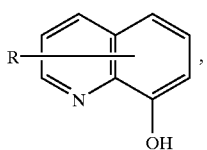
formula e)

in which the Rs are defined, independently of one another, as above;

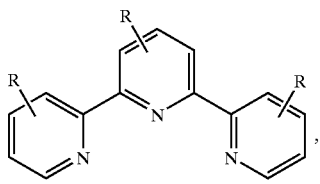
formula f)

in which the Rs are defined, independently of one another, as above.

* * * * *

UNITED STATES PATENT AND TRADEMARK OFFICE
CERTIFICATE OF CORRECTION

PATENT NO.    : 6,569,544 B1
DATED         : May 27, 2003
INVENTOR(S)   : Frank Alain Nuesch, Francois Rotzinger, Lynda Si-Ahmed and Libero Zuppiroli It is certified that error appears in the above-identified patent and that said Letters Patent is hereby corrected as shown below:

<u>Column 5,</u>
Line 29, please delete "chelatihg" and insert in lieu thereof -- chelating --.
Line 32, please delete "abetter" and insert in lieu thereof -- better --.

<u>Column 17,</u>
Line 7, please delete "$10^{31\ 3}$" and insert in lieu thereof -- $10^{-3}$ --.
Line 67, please delete "gdicarboxylic" and insert in lieu thereof -- dicarboxylic --.

<u>Column 19,</u>
Line 31, please delete "4,41" and insert in lieu thereof -- 4,4' --.

<u>Column 27,</u>
Line 10, please delete "tertiary quaternary" and insert in lieu thereof -- tertiary, quaternary --.

Signed and Sealed this

Eleventh Day of November, 2003

JAMES E. ROGAN
*Director of the United States Patent and Trademark Office*